Dec. 8, 1964 S. MITTLER 3,160,790

TUBULAR ELECTRIC CIRCUITS AND COMPONENT MOUNTED THEREON

Filed April 6, 1962 3 Sheets-Sheet 1

INVENTOR.
SHELDON MITTLER
BY
Howard Myles Schwinger
ATTORNEY

Dec. 8, 1964 S. MITTLER 3,160,790

TUBULAR ELECTRIC CIRCUITS AND COMPONENT MOUNTED THEREON

Filed April 6, 1962 3 Sheets-Sheet 2

INVENTOR.
SHELDON MITTLER
BY Howard Myles Schwinge
ATTORNEY

Dec. 8, 1964 S. MITTLER 3,160,790

TUBULAR ELECTRIC CIRCUITS AND COMPONENT MOUNTED THEREON

Filed April 6, 1962 3 Sheets-Sheet 3

INVENTOR.
SHELDON MITTLER
BY Howard Myles Schwinger
ATTORNEY 3,160,790
Patented Dec. 8, 1964

3,160,790

TUBULAR ELECTRIC CIRCUITS AND COMPONENT MOUNTED THEREON

Sheldon Mittler, 81 St. Marks Ave., Freeport, N.Y.

Filed Apr. 6, 1962, Ser. No. 185,758
1 Claim. (Cl. 317—101)

This invention relates to a method of mass producing electric circuits and to the circuits produced thereby.

Conventional mass produced electric circuits are produced in the form of the so-called printed circuit wherein a specific conductive pattern is reproduced on an insulative base in great quantity and extreme rapidity by the employment of the techniques of the graphic arts and other mass production techniques. In addition to the automatic and rapid production of circuits, the techniques of printed circuitry permit a degree of miniaturization heretofore not possible. A usual form taken by conventional printed circuits is that of a flat, metallic pattern bonded to a relatively stiff, impermeable plastic sheet.

As electronic systems have grown increasingly complex, their requirements have accordingly become more and more demanding. The printed circuits presently in use present major problems with regard to heat dissipation, interconnection, shielding and packaging, amongst other things, which unnecessarily limit the reliability and versatility theoretically possible with a mass produced circuit.

It is therefore amongst the primary objects of the present invention to provide a new technique for mass producing electric circuitry and additionally, to obtain circuits thereby which will adequately meet the demands of complex and severe applications A fuller understanding of the invention and the manner in which its objectives and advantages may be realized will become apparent from the following detailed description thereof taken in connection with the accompanying drawings wherein.

Figure 5:
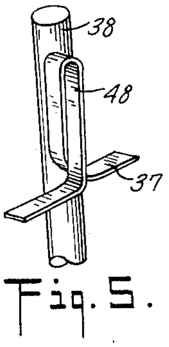
Figure 7:
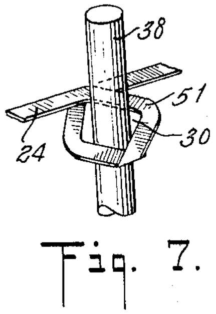
Figure 6:
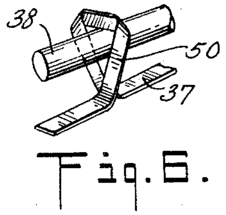

FIGS. 5–7 diagrammatically show other arrangements of the conductive pathways suitable for the mounting of components.

Figure 8:
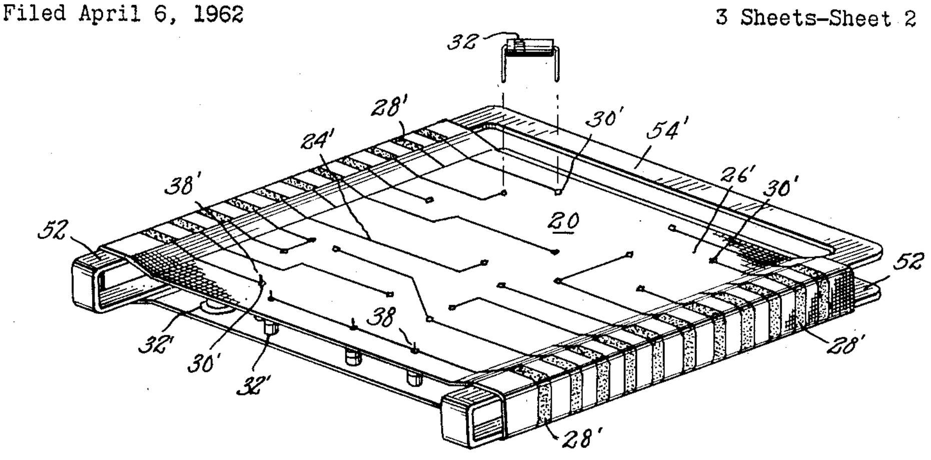

FIG. 8 shows another circuit in accordance with the present invention, and

Figure 9:
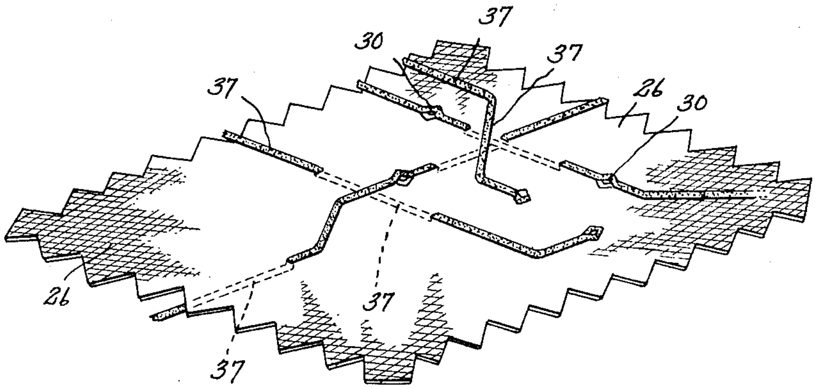

FIG. 9 is an enlarged view of still another fragment of conductive fabric.

Figure 10:
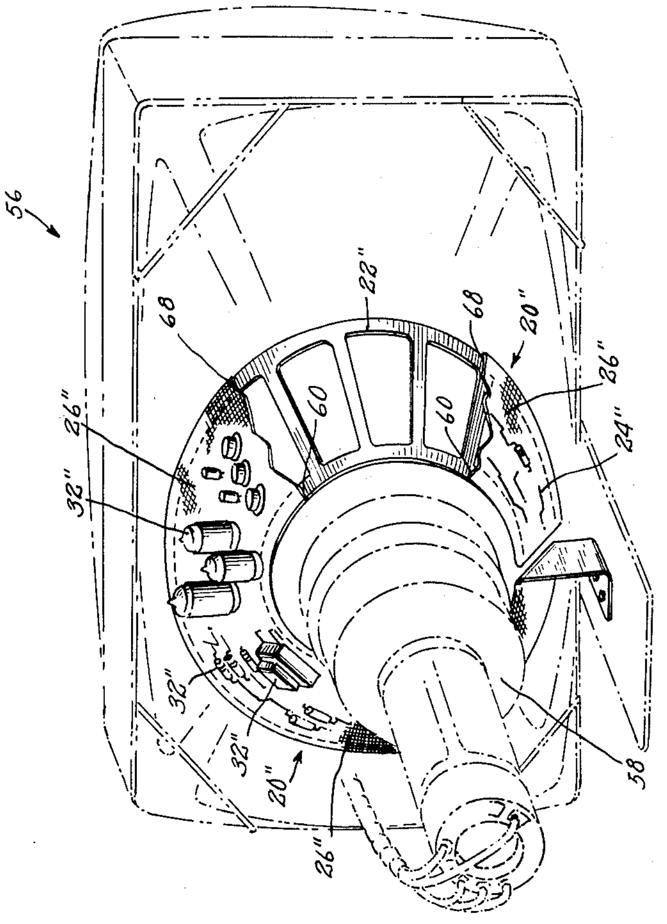

FIG. 10 is a perspective view of a portion of a television receiver showing an application of a circuit made in accordance with the present invention.

Figure 1:
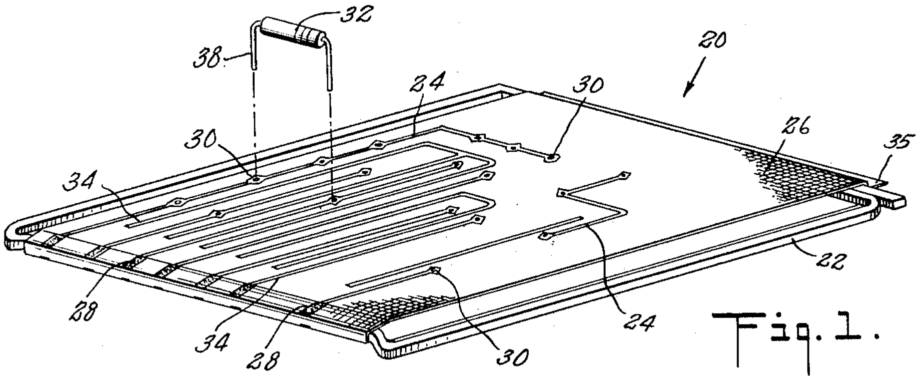
FIG. 1 is a perspective view of a circuit in accordance with the present invention.

Referring now to the drawings, an electric circuit in accordance with the present invention is shown in FIG. 1 and consists, in this particular embodiment of the invention, of a tubularly or sleeve shaped circuit 20 mounted upon a resilient frame 22. The circuit is of a woven composition formed by weaving conductive threads and insulative threads into a conductive fabric by existing textile methods. Circuits in accordance with the present invention may be embroidered, crocheted or loomed. Any of the procedures and methods of the textile art may be utilized to obtain the circuits of the present invention. Certain circuits, depending upon intended function of course, may be formed by embroidering or crocheting etc. upon a woven base The fabric thus formed may be supplied to the circuit assembler in the manner that conventional piece goods are supplied to a garment manufacturer, i.e. in strip form, rolled for convenience in handling. The fabric will, however, be covered with conductive patterns and individual circuits may be obtained therefrom by selectively cutting said strips.

The insulative threads that are utilized for this purpose should be highly temperature resistant and fiber glass, which is stable at temperatures above 1000° F., is highly recommended. Aside from being one of the best electrical insulating materials, fiber glass is fire proof, acid resistant, will not mildew or warp and its fiber have tensile strength at 220,000 p.s.i.

The conductive threads may be of copper and may be of a thickness of foil. The cross-sectional appearance of the conductive threads may vary from circular to rectangular. One or more conductive threads may make up a conductor in accordance with the present invention. In the circuit of FIG. 1, the conductive pathways are formed by at least two conductive threads.

The fabric is woven so that spaced conductive pathways 24 are formed in the weave which is otherwise generally of insulation 26. The conductive pathways are provided with woven terminals 28. Openings 30 may be woven in the conductive pathways to provide a mounting for components 32. Shielding 34 may be woven between said conductive pathways, if desired.

The fabric thus formed is collapsible and will not support itself. Additionally, the fabric is porous, the weave being a network of interlaced and spaced apart threads, as may be best seen in FIGS. 2 and 3. In some instances, as with the circuit of FIG. 1, it is preferable that the fabric have stretchable characteristics for reasons hereinafter appearing.

Figure 4:
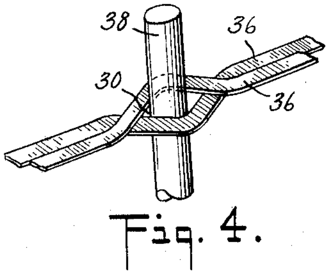

Circuit 20 assumes its tubular shape when the ends of a strip of such conductive fabric are sewn together as at 35. The fabric may be woven so that conductors will lie on the outside as well as the inside of the tubular unit. Additionally, conductors may pass through the thickness of the fabric, as is shown in FIG. 4, permitting individual conductors to continue on either side of the fabric. The length of the conductors may be such that the same will at least partially encircle the tubular unit, if desired.

Frame 22 which supports the circuit is resilient and may readily be flexed so that the circuit can be mounted thereon. The woven circuit is held taut by the frame and is, in this instance, somewhat stretched thereby. The frame is substantially rectangular and may be shaped from rod stock.

Figure 2:
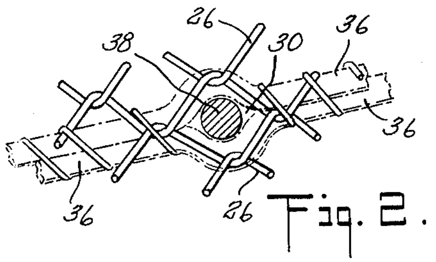
FIG. 2 is an enlarged view of a fragment of the fabric of FIG. 1 showing details of the weave.
Figure 3:
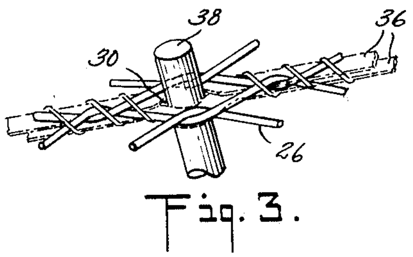
FIGS. 3 and 4 are enlarged views of fragments of the conductive weave after stretching.

In FIGS. 2 and 3, one of the openings 30 woven in conductive pathway 24 is shown in detail. In this instance, two abutting conductive threads 36 are utilized to form the said conductive pathway. Threads 36 are spaced apart at intervals along the conductive pathway to form the said opening. The opening is dimensioned so that the terminal 38 of a component may be inserted therethrough. The components are securely anchored to the conductive fabric when the same is stretched for upon stretching the threads forming the opening deform and clamp upon the terminal inserted therein to securely hold its component in the circuit. In this manner components may easily be affixed to the circuit of FIG. 1 without soldering or easily secured in place until permanently connected by soldering or other means.

In FIGS. 5–7, other arrangements suitable for the mounting of components are shown. In these modifications, a single conductive thread 37 is utilized to form a conductive pathway. When such is the case, a plurality of loops are formed in the conductive threads during the weaving of the conductive fabric. Loops 48 and 50 of FIGS. 5 and 6 extend outwardly of the circuit and provide their respective conductive pathways with a plurality of upstanding weld tabs to which the terminals may be welded. The loop of FIG. 5 provides for maximum joint strength and electrical conductivity whereas with the loop of FIG. 6, components may be mounted without penetrating the circuit and bending the component terminations.

It will be realized that in the circuit arrangement of FIG. 1, a single component having sufficiently long leads can be connected with multiple layers of circuitry merely by penetrating the same. This is highly advantageous in certain applications.

In FIG. 8 another frame mounted woven circuit 20′ is shown. In this embodiment, the components 32′ are mounted on the inside of the tubular circuit while the conductors 24′ are positioned on the outside thereof. With such an arrangement, components can be closely spaced and the meandering of conductors can be held to a minimum. The end result is, of course, shorter and hence faster operating circuits.

If operational speed be of the essence, the fabric may also be woven so that conductors pass through the thickness of the fabric to extend continuously on either side thereof, as is the case with conductor 36 in the fabric shown diagrammatically in FIG. 4. In this way conductor length may be held to a minimum whether the circuit is arranged tubularly or otherwise. Such cannot be the case, of course, with conventional printed circuit cards where widely spaced components and meandering conductors are the rule because of the necessarily planar arrangement of the conductors. The terminals 38′ of the components of FIG. 8 extend through the thickness of the conductive weave and are soldered to loops or eyelets 51 formed in the conductors. The formation of such a loop is shown diagrammatically in FIG. 7.

Because of the arrangement of conductors and components on opposite sides of the fabric as shown in FIG. 8 components, which are adversely affected by high temperatures, can be readily dip soldered to the circuit without much chance of damage. This is accomplished if only the outside of the tubular circuit is brought into contact with the hot solder bath. The solder will not come directly into contact with the components themselves and will just contact the component terminals if only the outerside of the fabric is immersed in the solder bath.

Because of the porous nature of the conductive weave, the components will not be damaged by the solder even if the conductors and components are arranged on the same side of the circuit, as is the case in FIG. 1. In this case, the solder will pass through the conductive weave and immerse the component terminals without necessarily involving the components themselves.

With conventional printed circuit cards it is not possible to shield the components from the solder to the extent afforded here.

The circuit frame of FIG. 8 consists of two spaced supporting arms 52 and 52′ maintained in spaced relationship by connecting bar 54. This frame may be flexed so that a circuit can be readily mounted thereon. The supporting arms are arranged so the collapsible circuit is maintained taut in a tubular state with ample room being provided for components 32′ within the chamber formed by the tubularly arranged circuit.

The conductive fabric need not, of course, be tubularly arranged but may be utilized in strip form. If such be the case, hems are provided at opposing edges of the fabric for mounting purposes.

FIG. 9 illustrates how such a circuit may be advantageously utilized with reference to television receiver 56. Frame 22″ extending circularly about picture tube 58 provides spaced rails upon which circuits such as circuit 20″ may be mounted. The said rails extend through mounting channels 60 formed at the edges of the circuit and support the same. Both the conductors 24″ and the components 32″ for the receiver may now be packaged in a circular fashion about the picture tube to provide a very compact unit.

It may be seen that woven circuits in accordance with the present invention offer packaging advantages beyond the scope of the stiff printed circuit board. A woven circuit can be deformed to assume a multitude of shapes and can be made to conform to the configuration of the structure requiring circuitry. Additionally, woven circuits are not as adversely affected by vibration and shocks as conventional printed circuits because of the damping effect inherent in a woven fabric. Furthermore, because of its porous nature, woven circuits can be readily and safely encapsulated. The foregoing is all of great importance in missile and other high speed applications.

Conventional printed circuits are subject to failure because of build-ups of heat originating from the components. This is one of the major disadvantages of printed circuits presently in use. With woven circuitry, heat is readily dissipated through the conductive weave and its not trapped between layers of circuitry as with conventional printed circuitry. The elimination of temperature build-ups in printed circuitry represents a major advance in the field.

Although the invention has been described in detail with respect to only a few preferred embodiments thereof, it will be understood by those skilled in the art, after reading this specification, that various changes and modifications may be made without departing from the spirit of the invention and the scope of the appended claim.

What is claimed as new and desired to be secured by Letters Patent is:

An electric circuit comprising a conductive fabric formed of electrically conductive and electrically insulative threads, said threads being interwoven into a collapsible, porous unit wherein conductive pathways are supported by insulation, said insulative threads being of a temperature resistant fiber, said conductive pathways including terminals, said unit being tubular, the conductive pathways being on the outside thereof, circuit components mounted on the inside of said tubular unit, said pathways being provided with connections for the terminals of said components.

References Cited by the Examiner

UNITED STATES PATENTS

| | | | |
|---|---|---|---|
| 857,367 | 6/07 | Shore et al. | 174—72 |
| 1,941,121 | 12/33 | Van Der Straeten. | |

FOREIGN PATENTS

| | | |
|---|---|---|
| 260,951 | 1/27 | Great Britain. |
| 474,565 | 4/29 | Germany. |

JOHN F. BURNS, *Primary Examiner.*

JOHN P. WILDMAN, *Examiner.*